United States Patent
Hwang et al.

(10) Patent No.: US 8,503,123 B2
(45) Date of Patent: Aug. 6, 2013

(54) OPTICAL FILTER AND FLAT DISPLAY PANEL COMPRISING THE SAME

(75) Inventors: Cha-Won Hwang, Suwon-si (KR); Sang-Mi Lee, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 109 days.

(21) Appl. No.: 12/639,897

(22) Filed: Dec. 16, 2009

(65) Prior Publication Data

US 2010/0165469 A1  Jul. 1, 2010

Related U.S. Application Data

(60) Provisional application No. 61/141,594, filed on Dec. 30, 2008.

(51) Int. Cl.
*G02B 5/22* (2006.01)
(52) U.S. Cl.
USPC .......................... 359/892; 313/112; 361/818
(58) Field of Classification Search
USPC .......................... 359/892; 313/112; 361/818
See application file for complete search history.

(56) References Cited

U.S. PATENT DOCUMENTS

| | | | |
|---|---|---|---|
| 2007/0108881 A1 | 5/2007 | Choi et al. | |
| 2007/0222915 A1 | 9/2007 | Niioka et al. | |
| 2008/0018247 A1 | 1/2008 | Park et al. | |

FOREIGN PATENT DOCUMENTS

| | | |
|---|---|---|
| EP | 1 775 605 A1 | 4/2007 |
| EP | 2 061 019 A1 | 5/2009 |
| EP | 2 098 362 A1 | 9/2009 |
| EP | 2 154 940 A1 | 2/2010 |
| EP | 2154940 A1 * | 2/2010 |
| JP | 2008026861 A | 2/2008 |
| KR | 20070052520 | 2/2007 |
| KR | 20070098242 | 10/2007 |
| KR | 10-2008-0095966 | 10/2008 |
| WO | WO 2007/069870 A1 | 6/2007 |
| WO | WO 2008/081904 A1 | 7/2008 |

OTHER PUBLICATIONS

European Search Report dated Mar. 31, 2010, for corresponding European Patent application 09252896.7, noting listed references in this IDS.
KIPO Office action dated Apr. 27, 2011, for corresponding Korean Patent application 10-2009-0122527.
European Search Report dated Oct. 13, 2011, for corresponding European Patent application 09252896.7, noting references previously submitted in an IDS dated Jul. 15, 2010, 4 pages.

\* cited by examiner

*Primary Examiner* — Anh T. Mai
*Assistant Examiner* — Brenitra M Lee
(74) *Attorney, Agent, or Firm* — Christie, Parker & Hale, LLP

(57) ABSTRACT

An optical filter including: a base film; and a function incorporation layer on the base film and for shielding electromagnetic interference and absorbing external light, the function incorporation layer having a cross mesh pattern, wherein the cross mesh pattern includes a plurality of pattern lines, and wherein at least a part of the cross mesh pattern protrudes from a surface of the function incorporation layer facing toward the reflection prevention layer.

26 Claims, 10 Drawing Sheets

OPTICAL FILTER AND FLAT DISPLAY PANEL COMPRISING THE SAME

CROSS-REFERENCE TO RELATED APPLICATION

This application claims priority to and the benefit of U.S. Provisional Patent Application No. 61/141,594, filed Dec. 30, 2008, the entire content of which is incorporated herein by reference.

BACKGROUND OF THE INVENTION

1. Field of the Invention

An aspect of the present invention relates to an optical filter and a flat display panel having the optical filter.

2. Description of the Related Art

As demand for large screen display panels increases among consumers, flat display panels have been widely developed. The flat display panels include liquid crystal displays (LCDs), plasma display panels (PDPs), field emission displays (FEDs), organic light emitting displays (OLEDs), and vacuum fluorescent displays (VFDs).

An optical filter is typically installed on the front surface of a flat display panel. The optical filter is used to protect the display panel from external shock or scratches, prevent reflection of external light, correct colors, shield EMI, enhance bright room contrast, and control other optical characteristics of the display panel. To perform these functions, the optical filter includes multiple function layers, which each include a film and an individual function layer formed on the film. Thus, manufacturing costs increase, and it is difficult to make flat display panel thinner.

SUMMARY OF THE INVENTION

An aspect of an embodiment of the present invention is directed toward an optical filter in which function layers for enhancing contrast and shielding electromagnetic interference (EMI) are incorporated, and a flat display panel having the optical filter.

An embodiment of the invention provides an optical filter including: a base film; and a function incorporation layer on the base film and for shielding electromagnetic interference and absorbing external light, the function incorporation layer having a cross mesh pattern, wherein the cross mesh pattern includes a plurality of pattern lines, and wherein at least a part of the cross mesh pattern protrudes from a surface of the function incorporation layer.

The function incorporation layer may include a base member on the base film, and the cross mesh pattern having at least a part thereof embedded in the base member.

The base member may have an inner wall defining a groove in the base member, and wherein each of the pattern lines may include: a first conductive layer including an inner portion on the inner wall of the groove and an outer portion; and a second conductive layer being on the inner portion and having a first portion inside the groove and a second portion protruding from a surface of the function incorporation layer; and the outer portion of the first conductive layer being on the second conductive layer.

The first conductive layer may have a higher external light absorption rate than that of the second conductive layer.

The second conductive layer may have a higher electric conductivity than that of the first conductive layer.

Each of the pattern lines may include: a first conductive layer; and a second conductive layer at least partially within the first conductor layer.

The optical filter may further include a reflection prevention layer, wherein the reflection prevention layer is coated on the function incorporation layer, exposed to light and developed to expose at least one edge portion.

The optical filter may further include an other base film on the function incorporation layer and a reflection prevention layer on the other base film, wherein the reflection prevention layer is on the other base film, and the reflection prevention layer and the other base film have a smaller size than the function incorporation layer for exposing at least one edge portion of the cross mesh pattern to ground the cross mesh pattern.

The pattern lines may include: a plurality of first pattern lines parallel to each other and extending in a substantially horizontal direction on a display panel; and a plurality of second pattern lines parallel to each other and extending in a substantially vertical direction on the display panel, the plurality of second pattern lines crossing the plurality of first pattern lines.

The pattern lines may include: a plurality of first pattern lines parallel to each other and extending in a first direction on a display panel; and a plurality of second pattern lines parallel to each other and extending in a second direction on the display panel, and wherein at least one of the first direction or the second direction is inclined with respect to a vertical or horizontal imaginary line on the display panel, the plurality of second pattern lines crossing the plurality of first pattern lines.

The pattern lines may include: a plurality of first pattern lines parallel to each other and separated by a first interval, each of the plurality of first pattern lines extending in a first direction and having a first width and a first height; and a plurality of second pattern lines parallel to each other and separated by a second interval, each of the plurality of second pattern lines extending in a second direction crossing the first direction and having a second width and a second height, wherein when the first width is substantially identical to the second width, the second height is smaller than the first height, and the second interval is larger than the first interval.

Another embodiment of the present invention provides a display device including: a display panel; a base film on the display panel; a function incorporation layer on the base film and for shielding electromagnetic interference and absorbing external light, the function incorporation layer having a cross mesh pattern, wherein the cross mesh pattern includes a plurality of pattern lines, and wherein at least a part of the cross mesh pattern protrudes from a surface of the function incorporation layer facing toward the reflection prevention layer.

The function incorporation layer may include a base member on the base film, and the cross mesh pattern having at least a part thereof embedded in the base member.

The base member may have an inner wall defining a groove in the base member, and wherein each of the pattern lines may include: a first conductive layer including an inner portion on the inner wall of the groove and an outer portion; and a second conductive layer being on the inner portion and having a first portion inside the groove and a second portion protruding from a surface of the function incorporation layer facing toward the reflection prevention layer; and the outer portion of the first conductive layer being on the second conductive layer.

Each of the pattern lines may include: a first conductive layer; and a second conductive layer at least partially within the first conductor layer.

The first conductive layer may have a higher external light absorption rate than that of the second conductive layer.

The second conductive layer may have a higher electric conductivity than that of the first conductive layer.

The display device may further include a reflection prevention layer, wherein the reflection prevention layer is coated on the function incorporation layer, exposed to light and developed to expose at least one edge portion.

The display device may further include an other base film on the function incorporation layer and a reflection prevention layer on the other base film, wherein the reflection prevention layer is on the other base film, and the reflection prevention layer and the other base layer film have a smaller size than the function incorporation layer for exposing at least one edge portion of the cross mesh pattern to ground the cross mesh pattern.

The pattern lines may include: a plurality of first pattern lines parallel to each other and extending in a substantially horizontal direction on a display panel; and a plurality of second pattern lines parallel to each other and extending in a substantially vertical direction on the display panel, the plurality of second pattern lines crossing the plurality of first pattern lines.

The pattern lines may include: a plurality of first pattern lines parallel to each other and extending in a first direction on a display panel; and a plurality of second pattern lines parallel to each other and extending in a second direction on the display panel, and wherein at least one of the first direction or the second direction is inclined with respect to a vertical or horizontal imaginary line on the display panel, the plurality of second pattern lines crossing the plurality of first pattern lines.

The pattern lines may include: a plurality of first pattern lines parallel to each other and separated by a first interval, each of the plurality of first pattern lines extending in a first direction and having a first width and a first height; and a plurality of second pattern lines parallel to each other and separated by a second interval, each of the plurality of second pattern lines extending in a second direction crossing the first direction and having a second width and a second height, wherein when the first width is substantially identical to the second width, the second height is smaller than the first height, and the second interval is larger than the first interval.

The display device may further include a color correction adhesive for attaching the base film to the display panel and for performing a color correction.

The display device may further include: a color correction layer on a surface of the base film facing the display panel; and a transparent adhesive between the color correction layer and the display panel.

The display device may further include a reflection prevention layer and another base film between the reflection prevention layer and the function incorporation layer, each of the reflection prevention layer and the another base film having a size for exposing the at least one edge portion of the cross mesh pattern to ground the mesh pattern.

Another embodiment of the present invention provides a display device including: a display panel; a base film on the display panel; a function incorporation layer on the base film and for shielding electromagnetic interference and absorbing external light, the function incorporation layer having a cross mesh pattern; a reflection prevention layer on the function incorporation layer and having a size for exposing at least one edge portion of the cross mesh pattern to ground the cross mesh pattern, wherein at least a part of the cross mesh pattern protrudes from a surface of the function incorporation layer facing toward the reflection prevention layer, wherein the cross mesh pattern includes: plurality of first pattern lines parallel to each other and separated by a first interval, each of the plurality of first pattern lines extending in a first direction and having a first width and a first height; and a plurality of second pattern lines parallel to each other and separated by a second interval, each of the plurality of second pattern lines extending in a second direction crossing the first direction and having a second width and a second height, wherein when the first width is set to be substantially identical to the second width, the second height is smaller than the first height, and the second interval is larger than the first interval, and wherein each of the first and second pattern lines includes: a first conductive layer; and a second conductive layer at least partially within the first conductor layer.

BRIEF DESCRIPTION OF THE DRAWINGS

The accompanying drawings, together with the specification, illustrate exemplary embodiments of the present invention, and, together with the description, serve to explain the principles of the present invention.

DETAILED DESCRIPTION

Figure 1:
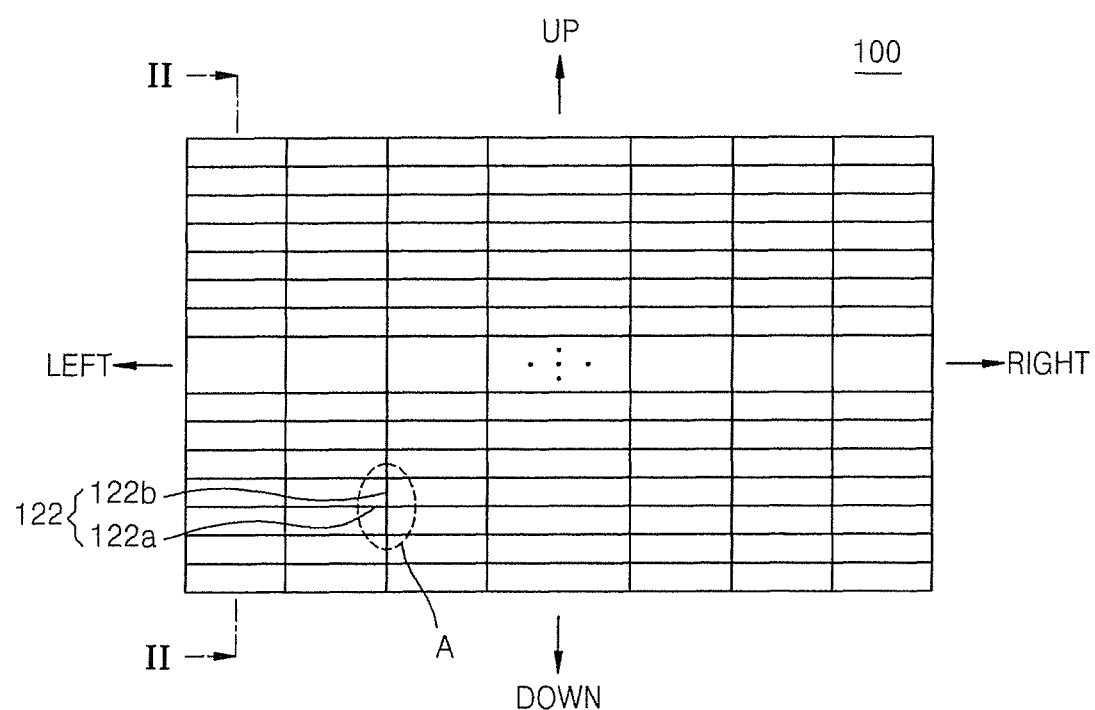
FIG. 1 is a plan schematic view of an optical filter according to an embodiment of the present invention.

In the following detailed description, only certain exemplary embodiments of the present invention are shown and described, by way of illustration. As those skilled in the art would recognize, the invention may be embodied in many different forms and should not be construed as being limited to the embodiments set forth herein. Also, in the context of the present application, when an element is referred to as being "on" another element, it can be directly on the another element or be indirectly on the another element with one or more intervening elements interposed therebetween. Like reference numerals designate like elements throughout the specification.

Figure 2:
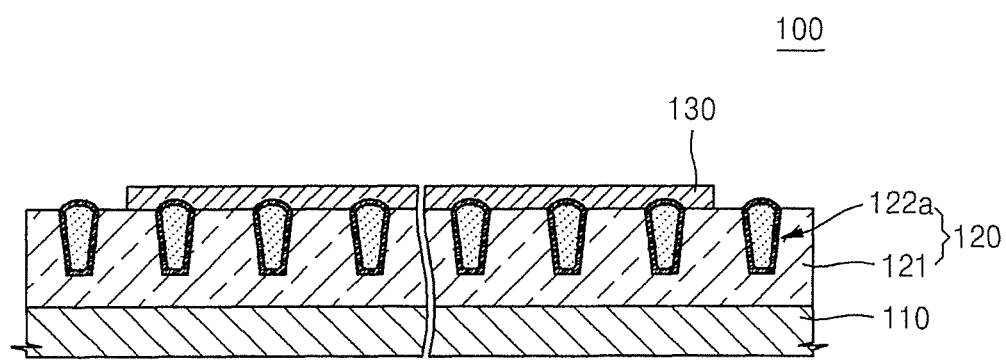
FIG. 2 is a cross-sectional schematic view taken along line II-II of FIG. 1.

FIG. 1 is a plan schematic view of an optical filter 100 according to an embodiment of the present invention. FIG. 2 is a cross-sectional schematic view taken along line II-II of FIG. 1. Referring to FIGS. 1 and 2, the optical filter 100 includes a first base film 110, a function incorporation layer 120, and a reflection prevention layer 130.

The first base film 110 may be formed of a material capable of transmitting a visible ray. The first base film 110 enables the optical filter 100 to be directly attached to the front surface of a display panel. The first base film 110 may be formed of a material including polyethersulphone (PES), polyacrylate (PAR), polyetherimide (PEI), polyethyelenen napthalate (PEN), polyethyelenetereptholate (PET), polyphenylene sulfide (PPS), polyallylate, polyimide (PI), polycarbonate (PC), triacetate cellulose (TAC), and/or cellulose acetate propinonate (CAP). However, the material of the first base film 110 is not limited thereto and any material that is flexible and capable of transmitting a visible ray may be employed.

The first base film 110 may have a set (or predetermined) color. Accordingly, the transmissivity of a visible ray of the optical filter 100 may be adjusted, a viewing experience may be improved, a color purity may be improved, or the color may be corrected. The function incorporation layer 120 is formed on the first base film 110. In the present embodiment, the function incorporation layer 120 is formed to both perform a bright room contrast enhancement function and the EMI shielding function. That is, the function incorporation layer 120 is a layer in which a contrast enhanced layer and an EMI shield layer are incorporated. The EMI shielding layer shields EMI that is generated by the display panel and harmful to a human body. The contrast enhanced layer enhances bright room contrast by absorbing external light. In the function incorporation layer 120, a mesh pattern 122 is partially buried in a base member 121. The mesh pattern 122 is formed to both perform the bright room contrast enhancement function and the EMI shielding function, which will be described in more detail later.

The mesh pattern 122a extends horizontally and parallel to one another, and the mesh pattern 122b extends vertically and parallel to one another, as shown in FIG. 1. The mesh pattern extending horizontally is referred to as a first mesh pattern 122a, while the mesh pattern extending vertically is referred to as a second mesh pattern 122b. The mesh patterns 122a and 122b protrude from the upper surface of the base member 121 in the function incorporation layer 120. Thus, a grounding function to a ground member of the display panel may be improved.

In the present embodiment, the reflection prevention layer 130 may include a reflection reduction layer and a surface hardness enforcement layer. The reflection reduction layer may be formed of either an anti-reflection (AR) layer or an anti-glare (AG) layer. Alternatively, the reflection reduction layer may be formed of an AR/AG combined layer. Thus, the reflection reduction layer disperses the external light at a surface thereof and reduces (or prevents) the reflection of the surrounding environment by the surface of the optical filter 100.

In another embodiment, the reflection prevention layer 130 may be formed of a single layer of a surface hardness enforcement layer. The surface hardness reinforcement layer is a hard coating layer including a hard coating material. Thus, the reflection prevention layer 130 may protect against scratches on the optical filter 100 generated by external matter(s).

In the present embodiment, the reflection prevention layer 130 is formed on the function incorporation layer 120. The reflection prevention layer 130 may be formed by coating, for example, a roll wet coating. The reflection prevention layer 130 is formed away from an edge portion of the function incorporation layer 120 such that the mesh pattern 122 may be exposed above the base member 121. As a result, ground to the ground member is possible. The method for forming the function incorporation layer 120 and the reflection prevention layer 130 on and above the first base film 110 is described in more detail below. The characteristics, materials, and formation method of the reflection prevention layer 130 are not limited to the above-described embodiment.

Referring to FIGS. 3A-3D, in a method of forming the function incorporation layer 120 for enhancing contrast and shielding EMI of FIG. 2, the base member 121 having a groove 121a is prepared. The base member 121 with the groove 121a may be made by coating a base material forming the base member 121 on a mold designed according to a set (or predetermined) mesh pattern 122 and curing, for example, UV curing, the coated base member 121. Alternatively, the groove 121a may be formed in a flat base member 121 in a laser etch method performed according to the set (or predetermined) mesh pattern 122.

Next, a first conductive layer 122aa is formed on the groove 121a of the base member 121. The first conductive layer 122aa is not necessarily black in color and may be in a dark color that is dark enough to effectively absorb external light. For example, the first conductive layer 122aa may be grey. Thus, the mesh pattern 122 of the function incorporation layer 120 enhances bright room contrast. The first conductive layer 122aa may have a low electrical conductivity. The first conductive layer 122aa may be formed of, for example, a material including chromium (Cr) or nickel (Ni).

Next, a second conductive layer 122ab is formed on the first conductive layer 122aa. The second conductive layer 122ab is to supplement the low conductivity of the first conductive layer 122aa so that the second conductive layer 122ab may be formed by plating a metal exhibiting an electrical resistance lower than that of the first conductive layer 122aa. The second conductive layer 122ab may be formed of, for example, a material including aluminum (Al), silver (Ag), or copper (Cu). Thus, the electric conductivity of the second conductive layer 122ab is greater than that of the first conductive layer 122aa. As a result, the mesh pattern 122 of the function incorporation layer 120 may shield EMI with the same effect as that of the conventional EMI shield layer.

Finally, a third conductive layer 122ac is formed on the second conductive layer 122ab. Although the third conductive layer 122ac may be formed of the same (or substantially the same) material as and in the same (or substantially the same) method as that of the first conductive layer 122aa, the present invention is not limited thereto. In one embodiment, the third conductive layer 122ac has a color that can absorb the external light better than the second conductive layer 122ab.

Figure 3A:
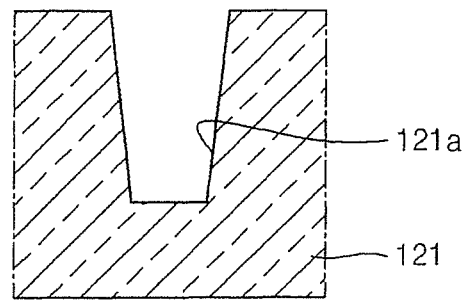
FIGS. 3A-3D are cross-section schematic views showing the sequence of a method for forming a function incorporation layer for enhancing contrast and shielding EMI shown in FIG. 2.
Figure 3B:
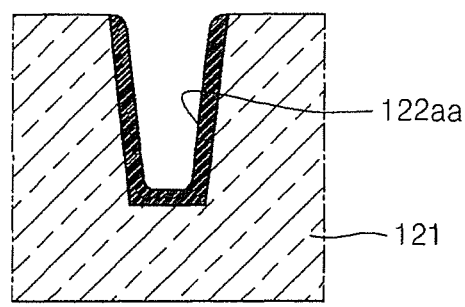
Figure 3C:
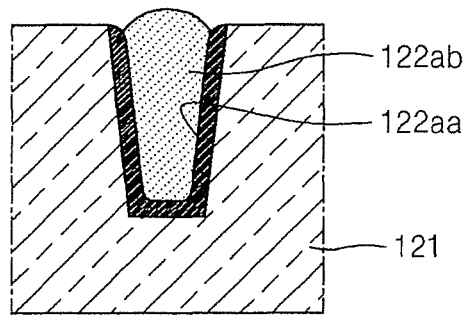
Figure 3D:
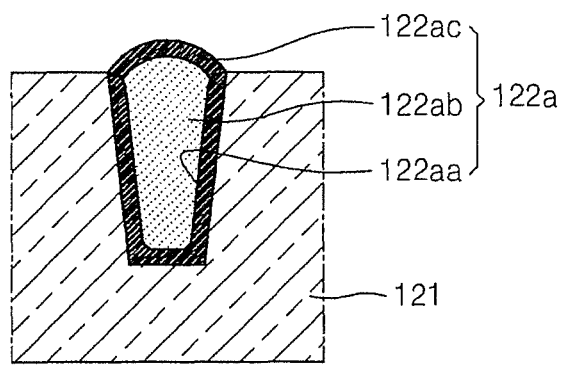

As described above, as the second conductive layer 122ab exhibiting a higher electrical conductivity but a lower external light absorption characteristic is surrounded by the first conductive layer 122aa and the third conductive layer 122ac that are darker than the second conductive layer 122ab, the bright room contrast of the function incorporation layer 120 may be enhanced. Also, since the second conductive layer 122ab exhibiting a higher electrical conductivity exists in the mesh pattern 122 of the function incorporation layer 120, the EMI shield function may also be enhanced. In an embodiment in which the process of FIG. 3D is omitted, the second conductive layer may be formed by utilizing a metal having a dark color, if possible, only when the electrical resistance of the metal is lower than that of the first conductive layer.

Figure 4:
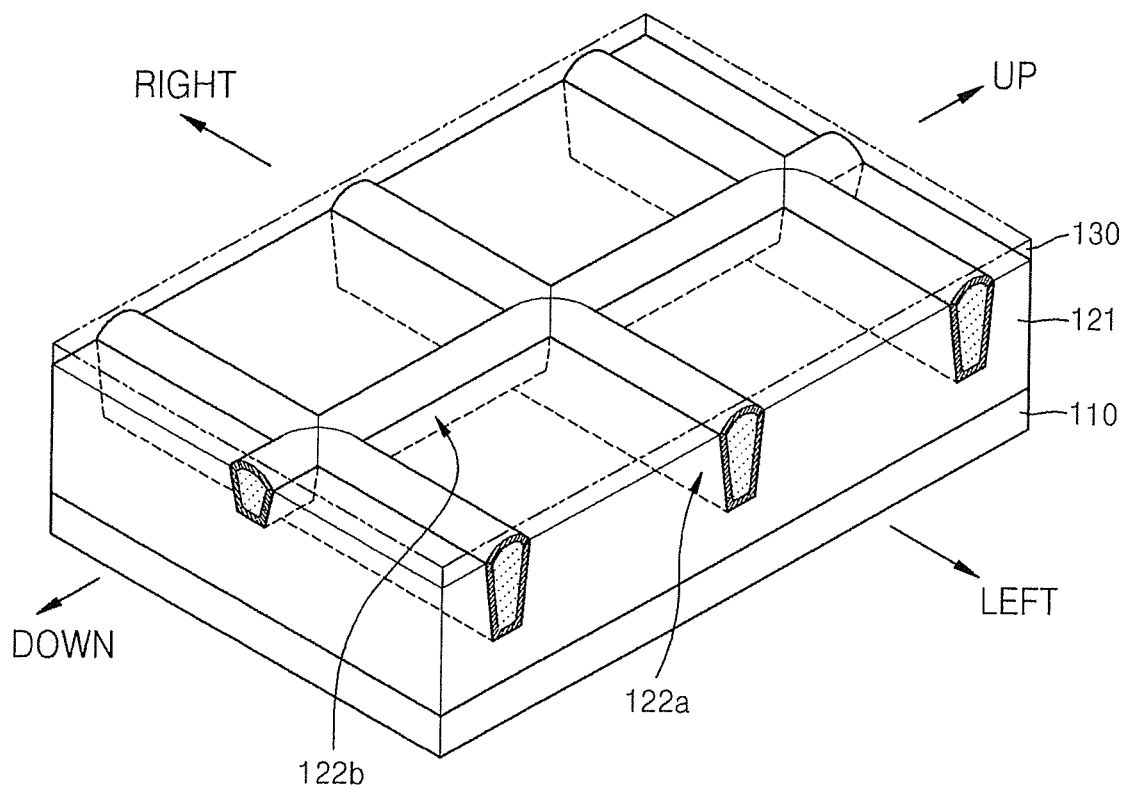
FIG. 4 is an enlarged perspective schematic view of a portion A of FIG. 1.

FIG. 4 is an enlarged perspective view of a portion A of FIG. 1. Referring to FIG. 4, the mesh pattern 122 of the function incorporation layer 120 includes the first mesh pattern 122a extending horizontally and parallel to each other and the second mesh pattern 122b extending vertically and parallel to each other. Since the first mesh pattern 122a is arranged to extend horizontally, the first mesh pattern 122a mainly absorbs external light incident at an angle from the upper or lower side of the display panel. Also, since the second mesh pattern 122b is arranged to extend vertically, the second mesh pattern 122b mainly absorbs external light incident at an angle from the left or right side of the display panel. A horizontal viewing angle is generally more noticeable (important) than a vertical viewing angle in a flat display panel. Also, in general, it is more important to absorb the external light that is vertically incident. Here, the mesh pattern 122 limits the viewing angle, but absorbs external light.

Thus, in the horizontal direction, since the absorption of external light is less important, but obtaining a wide viewing angle is more important, to decrease the effect of the second mesh pattern 122b absorbing the external light that is horizontally incident and assuming that the width of the first mesh pattern 122a is the same as that of the second mesh pattern 122b, the height of the second mesh pattern 122b is set to be lower than that of the first mesh pattern 122a. Also, the interval between each part of the second mesh pattern 122b is set to be greater than that between each part of the first mesh pattern 122a. In contrast, in the vertical direction, since obtaining a wide viewing angle is less important, but the absorption of external light is more important, to increase the effect of the first mesh pattern 122a absorbing external light that is vertically incident and assuming that the width of the first mesh pattern 122a is the same (or substantially the same) as that of the second mesh pattern 122b, the height of the first mesh pattern 122a is set to be greater than that of the second mesh pattern 122b. Also, the interval between each part of the first mesh pattern 122a is set to be less than that between each part of the second mesh pattern 122b.

Thus, the optical filter 100 according to the present embodiment is configured such that the absorption of external light in the vertical direction in which incident external light is relatively large may be increased (or maximized) and the obtaining of a viewing angle in the horizontal direction may be increased (or maximized). The mesh pattern 122 of the function incorporation layer 120 of the optical filter 100 is formed both in the vertical and horizontal directions and has a sufficiently high electric conductivity so that the EMI shield function may be sufficiently performed.

In the embodiment of FIG. 4, the height of the second mesh pattern 122b is lower than that of the first mesh pattern 122a, but the present invention is not limited thereto. For example, the purpose of an aspect of the present invention may be achieved even when the height of the second mesh pattern 122b is not lower than that of the first mesh pattern 122a, which will be described below with reference to FIG. 5.

Figure 5:
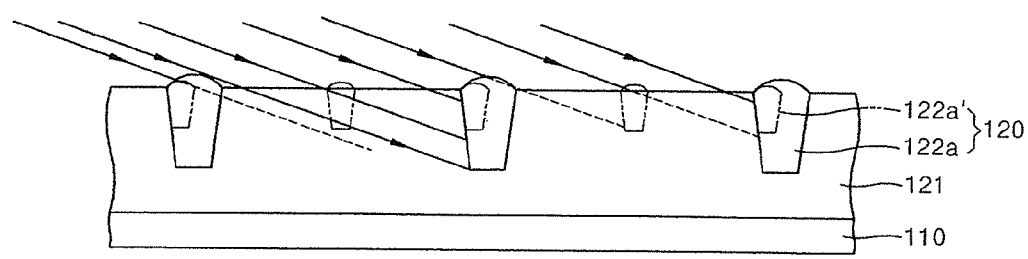
FIG. 5 illustrates the blocking of incident light in the function incorporation layer for enhancing contrast and shielding EMI.

FIG. 5 illustrates the blocking of incident light in the function incorporation layer 120 for enhancing contrast and shielding EMI. The size of a mesh pattern 122a' indicated by a two-dot chain line and the interval between the mesh patterns are, respectively, ½ of the size of the mesh pattern 122a indicated by a solid line and ½ of the interval between the mesh patterns 122a. FIG. 5 shows that the same external light absorption effect may be obtained in both of the embodiment of the optical filter 10 having the mesh pattern 122a indicated by a solid line and the embodiment of the optical filter 10 having the mesh pattern 122a' indicated by a two-dot chain line.

In more detail, assuming that external light is incident at a set (or predetermined) inclination with respect to the surface of the optical filter 100, external light incident (indicated by the arrows) at the inclination shown in FIG. 5 is all absorbed by the mesh pattern 122a indicated by the solid line. Likewise, external light incident (indicated by the arrows) at the same inclination is all absorbed by the mesh pattern 122a' indicated by the two-dot chain line. That is, in an ideal state, even when the size (height) of the mesh pattern 122 decreases, by decreasing the interval between each of the mesh pattern 122a at a similar or the same rate, the capability of absorbing external light may be about the same (or maintained unchanged).

Figure 6:
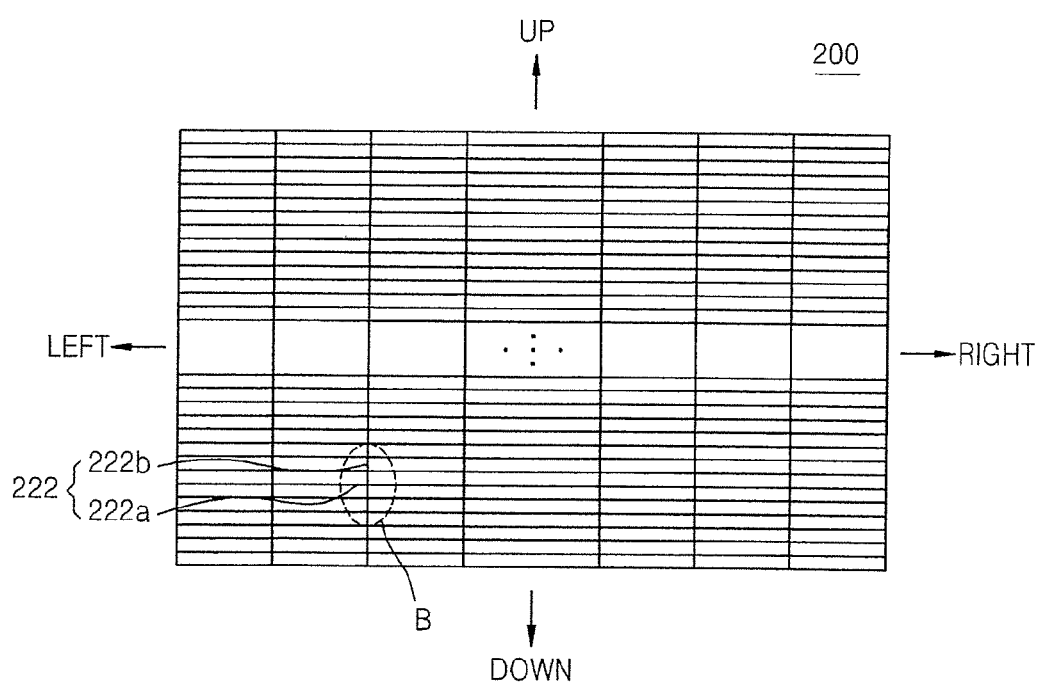
FIG. 6 is a plan schematic view of an optical filter according to another embodiment of the present invention.
Figure 7:
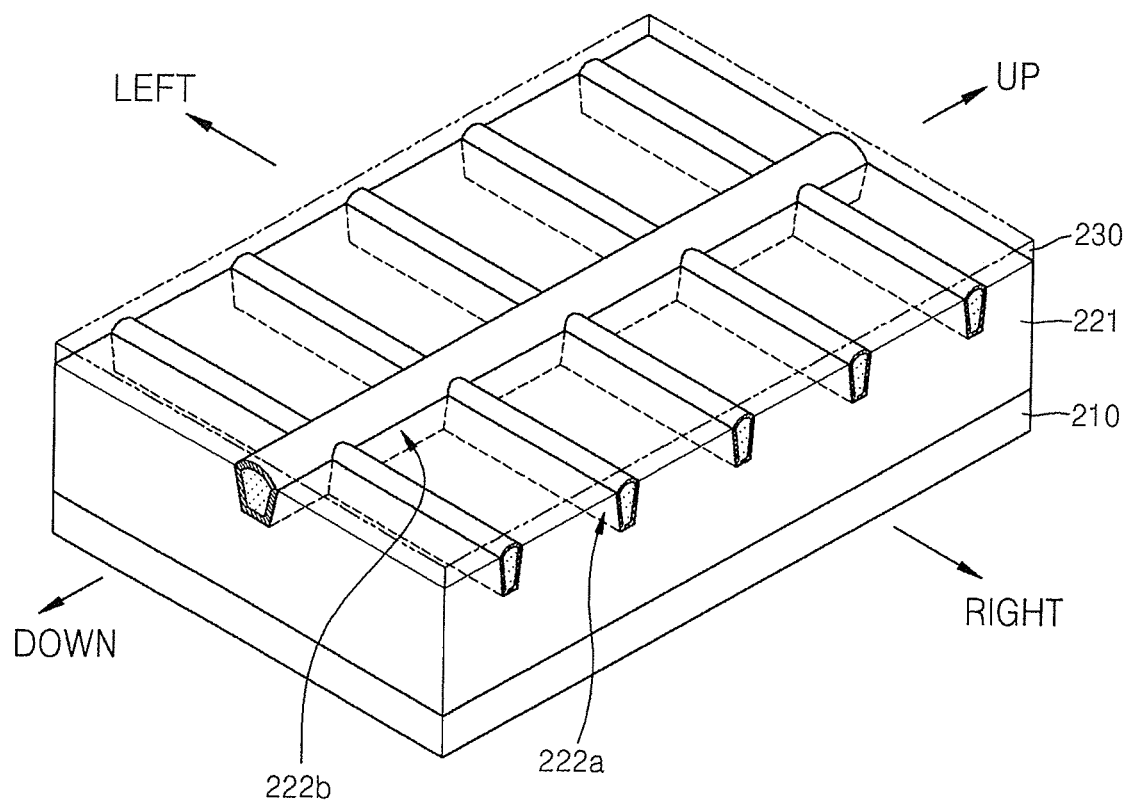
FIG. 7 is an enlarged perspective schematic view of a portion B of FIG. 6.

FIGS. 6 and 7 schematically illustrate an optical filter 200 according to an embodiment of an aspect of the present invention in which the overall size of the first mesh pattern 222a extending horizontally and parallel to each other using the above principle is decreased by half and the interval between each of the first mesh patterns 222a is also decreased by half. Referring to FIGS. 6 and 7, while the size of a second mesh pattern 222b and the interval between each of the second mesh pattern 222b are maintained unchanged, the size of a first mesh pattern 222a and the interval between each of the first mesh pattern 222a are decreased by half. Accordingly, unlike the embodiment shown in FIG. 4, in the embodiment shown in FIG. 7, the height of the second mesh pattern 222b is not less than that of the first mesh pattern 222a. Thus, by adjusting the interval between each of the second mesh pattern 222b or the interval between each of the first mesh pattern 222a, the technical object of an aspect of the present invention may be achieved without forming the second mesh pattern 222b to be lower than the first mesh pattern 222a.

Figure 8:
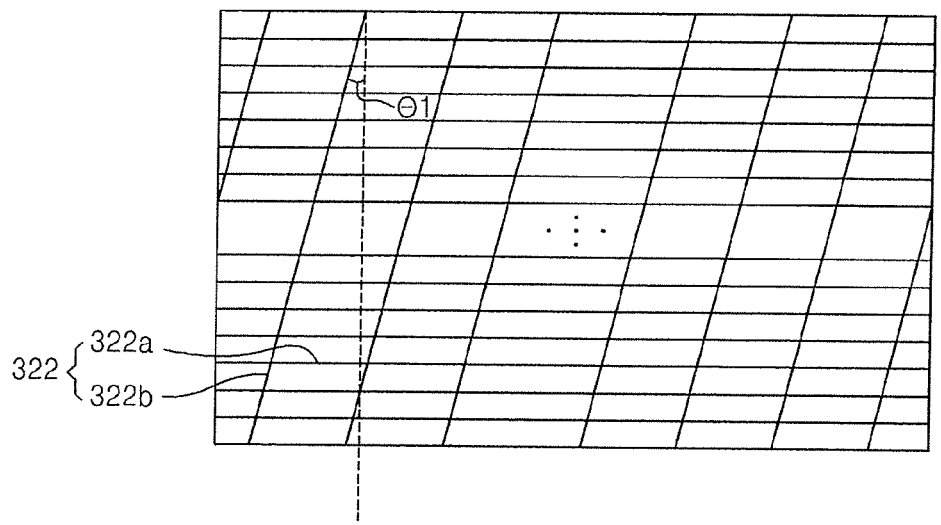
FIG. 8 is a plan schematic view of a modified example of the optical filter of FIG. 1.

FIG. 8 is a plan view of an optical filter 300 according to a modified example of the optical filter of FIG. 1. The optical filter 300 of the present embodiment is different from the optical filter 100 of FIG. 1 in that a second mesh pattern 322b is inclined at a set (or predetermined) angle of θ1, for example, inclined at an angle θ1 between 0° and 45°, with respect to a vertical imaginary line. This modified example is designed to reduce a Moiré phenomenon that might otherwise occur due to interference between the mesh pattern 122 of the function incorporation layer 120 and the pattern of the display panel 10, that is, all patterns that may be generated from the display panel 10 including an electrodes pattern and a barrier ribs pattern. In particular, since a first mesh pattern 322a extending horizontally greatly contributes to the absorption of the external light incident vertically, the first mesh pattern 322a is maintained parallel to a horizontal imaginary line. The present embodiment is particularly desired for this in mind. However, the present invention is not limited thereto.

Figure 9:
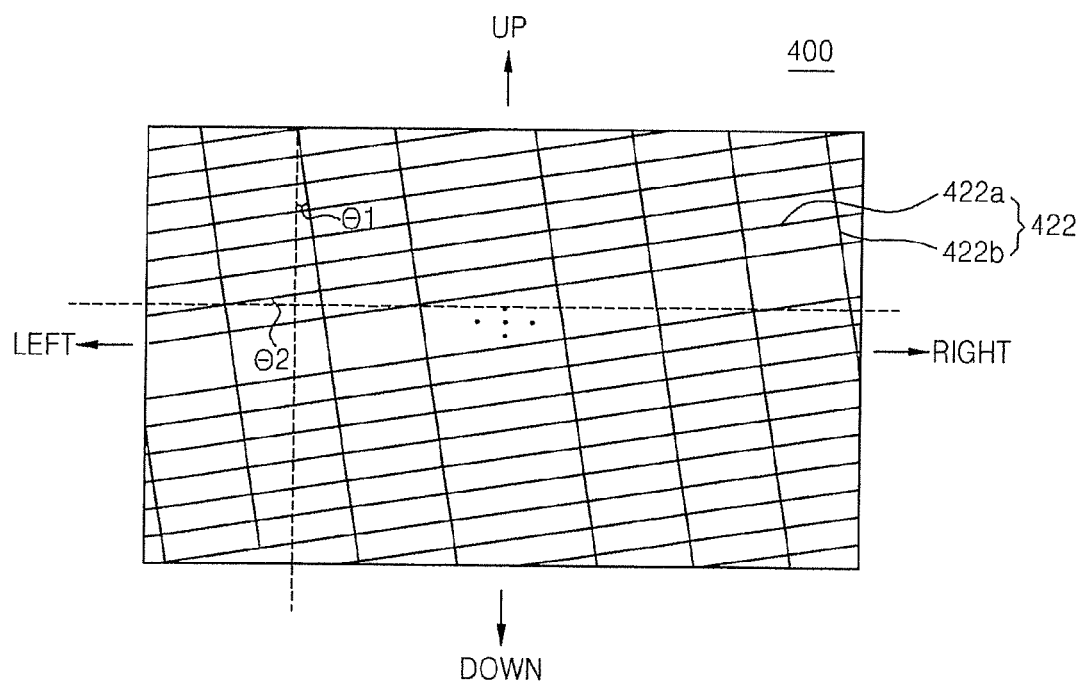
FIG. 9 is a plan schematic view of another modified example of the optical filter of FIG. 1.

As another modified example of the embodiment of FIG. 1, a mesh pattern 422 of an optical filer 400 may be arranged as shown in FIG. 9. Referring to FIG. 9, in the optical filter 400 of the present embodiment, a second mesh pattern 422b is inclined at a set (or predetermined) angle of θ1, for example, inclined at an angle θ1 between 0° and 45°, with respect to a vertical imaginary line, and a first mesh pattern 422a is inclined at a set (or predetermined) angle of θ2, for example, inclined at an angle θ2 between 0° and 45°, with respect to a horizontal imaginary line, which is a difference from the embodiment of FIG. 1. The reason for this is the same (or substantially the same) as that described above for the embodiment of FIG. 8.

Figure 10:
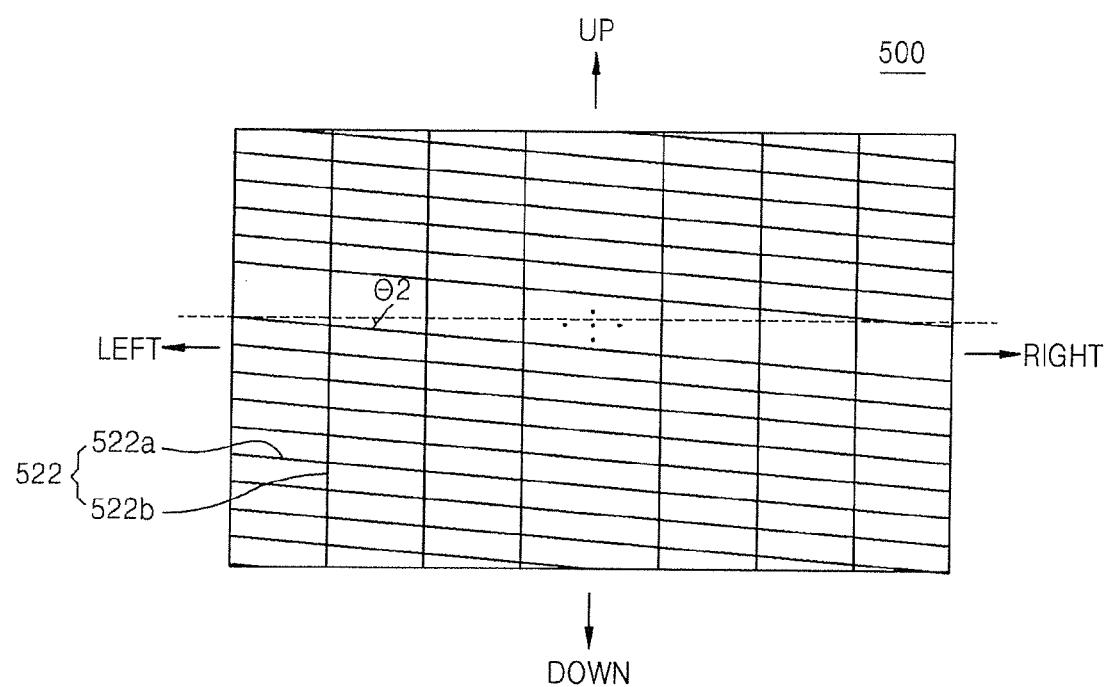
FIG. 10 is a plan schematic view of another modified example of the optical filter of FIG. 1.

As another modified example of the embodiment of FIG. 1, a mesh pattern 522 of an optical filer 500 may be arranged as shown in FIG. 10. Referring to FIG. 10, in the optical filter 500 of the present embodiment, a first mesh pattern 522a is inclined at a set (or predetermined) angle of θ2, for example, inclined at an angle θ2 between 0° and 45°, with respect to a horizontal imaginary line, which is a difference from the optical filter 100 of FIG. 1. The reason for this is the same (or substantially the same) as that described above for the embodiment of FIG. 8.

FIGS. 11A-11D are cross-sectional schematic views illustrating a method for manufacturing an optical filter 100 according to an embodiment of an aspect of the present invention. First, the base member 121 with a groove 121a is arranged on the first base film 110. For example, the base member 121 may be formed by transferring a shape of a mold having a set (or predetermined) mesh pattern 122 to a base material coated on the first base film 110. Alternatively, after the base member 121 that is flat is formed on the first base film 110, the groove 122a may be formed in the upper surface of the base member 121, for example, by a laser etch method.

Figure 11A:
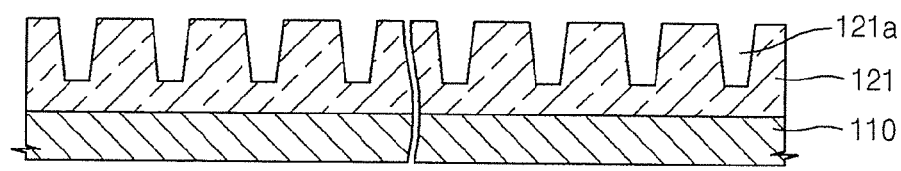
FIGS. 11A-11D are cross-sectional schematic views illustrating a method for manufacturing an optical filter according to an embodiment of the present invention.
Figure 11B:
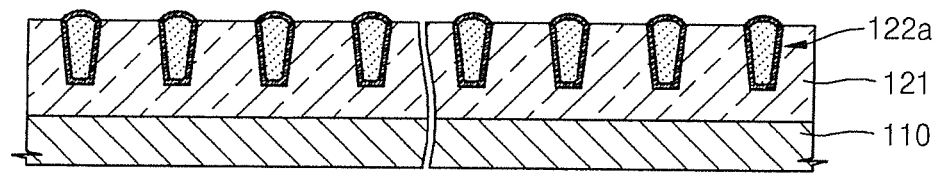

The function incorporation layer 120 is completed by forming the mesh pattern 122 on the base member 121 shown in FIG. 11B. The function incorporation layer 120 may be formed in the method described with reference to FIGS. 3A-3D.

Figure 11C:
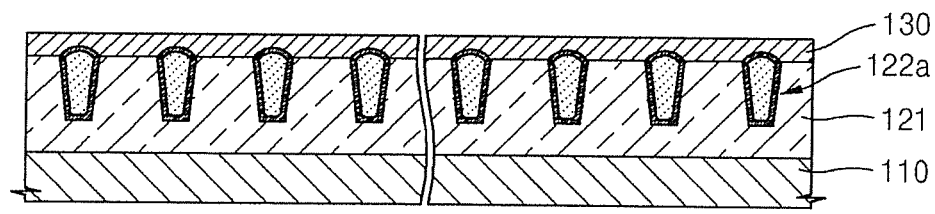

A material forming the reflection prevention layer 130 is coated on the function incorporation layer 120 shown in FIG. 11C. For the reflection prevention layer 130, the above descriptions will be referred to. Both side edge portions of the function incorporation layer 120 are separated from the reflection prevention layer 130 (or side edge portions of the reflection prevention layer 130 are removed from the function incorporation layer 120) to externally expose the mesh pattern 122 formed at both side edge portions of the function incorporation layer 120. The separation may be performed by a physical and/or chemical method. For example, chemical etching and/or an optical method by utilizing a laser may be used for the separation. Also, a physical separation in a method of attaching an adhesive tape and detaching the same may be used.

Figure 11D:
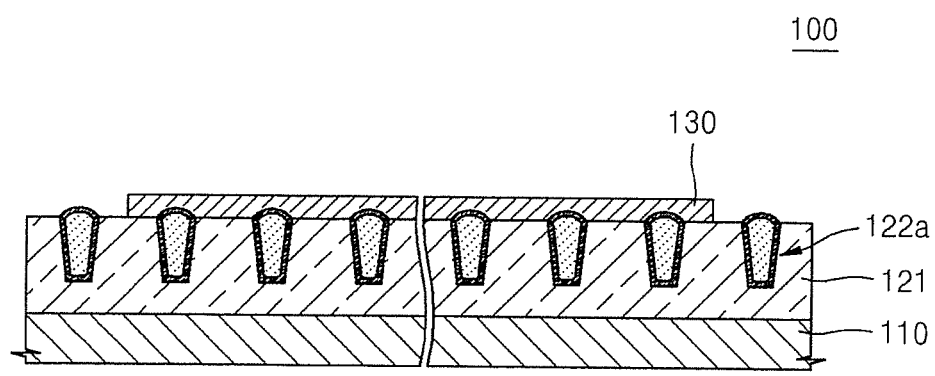

FIG. 11D illustrates that both side edge portions of the function incorporation layer 120 are separated from the reflection prevention layer 130, but the scope of the present invention is not limited thereto. For example, only one side edge portion, both side edge portions, or all four side edge portions of the function incorporation layer 120 may be separated from the reflection prevention layer 130.

Figure 12:
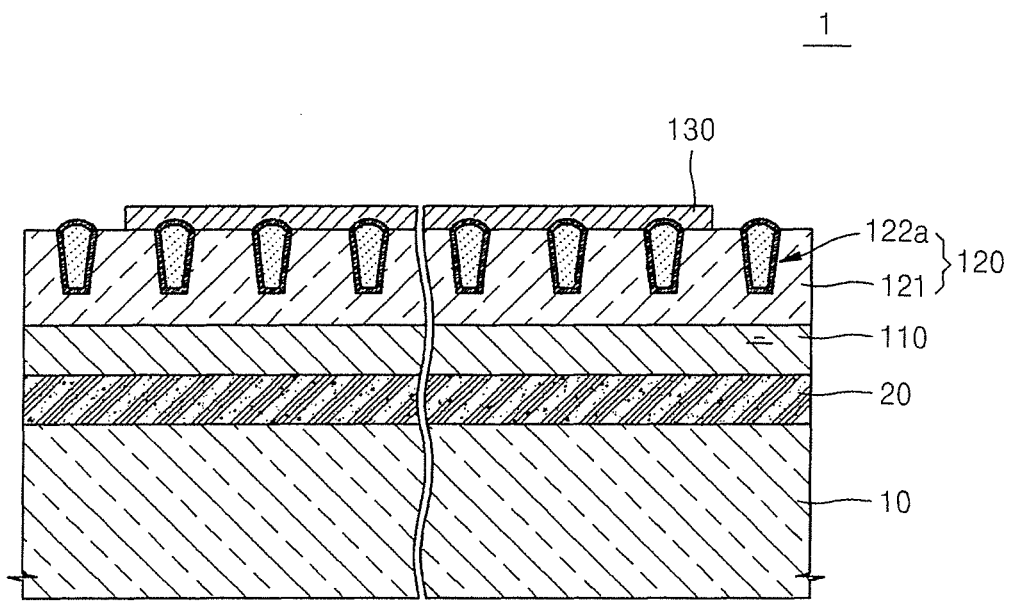
FIG. 12 is a cross-sectional schematic view of a flat display panel having an optical filter according to an embodiment of the present invention.

FIG. 12 is a cross-sectional schematic view of the flat display panel 1 having the optical filter 100 according to an embodiment of an aspect of the present invention. Referring to FIG. 12, the flat display panel of the present embodiment is manufactured by attaching the first base film 110 of the optical filter 100 manufactured in the method shown in FIGS. 11A-11D to the display panel 10 using a color correction adhesive 20. Here, the color adhesive layer 20 may perform both color correction and adhesion function. By incorporating the color correction layer and the adhesive layer as a single layer, manufacturing costs may be reduced and the manufacturing process may be simplified.

Thus, as the function incorporation layer 120 and the reflection prevention layer 130 both are included in the first base film 110, manufacturing costs are reduced and a manufacturing process is simplified so that the flat display panel 1 may be made thinner. Also, not only the EMI shield function but also the bright room contrast enhancement function may be performed by the function incorporation layer 120 that is a single layer.

Figure 13:
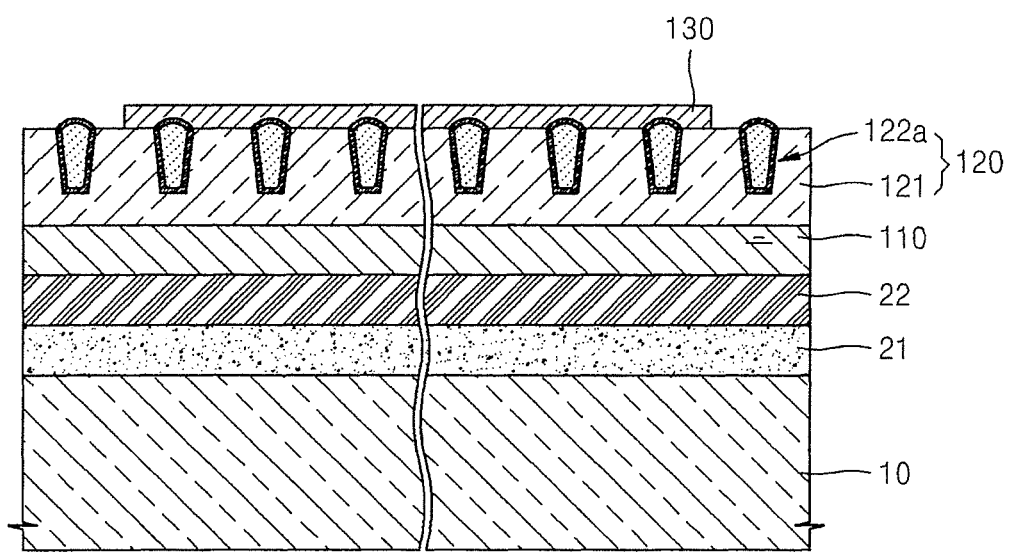
FIG. 13 is a cross-sectional schematic view of a flat display panel having an optical filter according to another embodiment of the present invention.

FIG. 13 is a cross-sectional view of a flat display panel 2 having an optical filter according to another embodiment of an aspect of the present invention. The present embodiment is different from the embodiment of FIG. 12 in that a color correction layer 22 and an adhesive layer 21 are separately formed. In the optical filters according to the above-described embodiments, both of the function incorporation layer 120 and the reflection prevention layer 130 are formed on the base film 110 that is a single layer. However, the present invention is not limited thereto.

Figure 14:
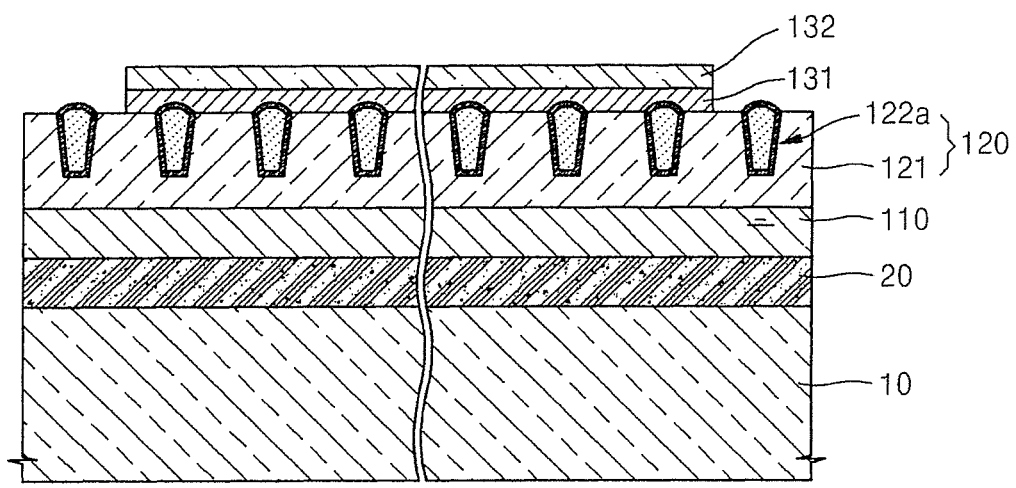
FIG. 14 is a cross-sectional schematic view of a flat display panel having an optical filter according to another embodiment of the present invention.

FIG. 14 is a cross-sectional view of a flat display panel 3 having an optical filter according to another embodiment of an aspect of the present invention. Referring to FIG. 14, a reflection prevention layer 132 may be formed on a separate base film 131, and the reflection prevention films 131 and 132 may be formed on the function incorporation layer 120. The sizes of the reflection prevention films 131 and 132 are determined such that the mesh pattern 122 at least one side edge portion of the function incorporation layer 120 may be exposed. Thus, a separate separation process is not needed.

The flat display panels 1, 2, and 3 according to the embodiments of an aspect of the present invention may be PDPs, LCDs, FEDs, OLEDs, or VFDs. Also, the optical filters 100, 200, 300, 400, and 500 according to the embodiments of an aspect of the present invention may be used for PDPs, LCDs, FEDs, OLEDs, or VFDs.

As described above, the optical filters according to embodiments of an aspect of the present invention and the flat display panels according to embodiments of an aspect of the present invention may include both of the function incorporation layer and the reflection prevention layer on a single base film. Thus, manufacturing costs are reduced, a manufacturing process is simplified, and a flat display panel may be made thinner. Also, not only the EMI shielding function but also the bright room contrast enhancement function may be performed by a single function incorporation layer.

An aspect of the present invention may be utilized in the fields of manufacturing and using an optical filter and a flat display panel having the optical filter.

An aspect of an embodiment of the invention provides an optical filter including a base film, a function incorporation layer formed on a first surface of the base film, and a reflection prevention layer formed on the function incorporation layer, wherein the function incorporation layer shields electromagnetic interference and absorbs external light. Both of the function incorporation layer and the reflection prevention layer are provided on a single base film. Thus, manufacturing costs may be reduced, a manufacturing process may be simplified, and a flat display panel may be made thinner.

The function incorporation layer has a mesh pattern having cross patterns in it and at least a part of the mesh pattern may protrude from an upper surface of the function incorporation layer. The function incorporation layer may include a base member formed on a first surface of the base film and a mesh pattern having at least a part thereof buried in the base member and having cross patterns in it. Thus, a ground capability with a ground member of a display panel is guaranteed.

The reflection prevention layer may be coated on the function incorporation layer. In this case, a separate base film for the reflection prevention layer is not needed. Since all function layers are formed on a single base film, manufacturing costs may be reduced. However, an edge portion corresponding to the reflection prevention layer can be separated so that the mesh pattern at least one side edge portion of the display panel may be externally exposed.

Alternatively, a reflection prevention film on which the reflection prevention layer is formed may be coupled to the function incorporation layer after the reflection prevention layer is formed on the separate base film. In this case, the size of the reflection prevention film is determined so that the mesh pattern at least one side edge portion of the function incorporation layer may be exposed. Thus, a separate separation process is not needed.

The mesh pattern may include a first mesh pattern extending in an approximately horizontal direction on the display panel and parallel to each other and a second mesh pattern extending in an approximately vertical direction on the display panel and parallel to each other. The first and second mesh patterns form cross patterns.

Alternatively, the second mesh pattern may be formed to be inclined with respect to a vertical imaginary line. Then, a Moiré phenomenon generated with the pattern, for example, a lattice shaped pattern, of the display panel may be prevented. Additionally, the first mesh pattern may be formed to be inclined with respect to a horizontal imaginary line. Alternatively, only the first mesh pattern may be formed to be inclined with respect to the horizontal imaginary line.

Assuming that the width of the first mesh pattern and the width of the second pattern are identical or almost similar to each other, the height of the second mesh pattern is smaller than that of the first mesh pattern. Also, the interval between the second mesh patterns is larger than that between the first mesh patterns. Accordingly, the external light incident in the vertical direction that has a great effect on a bright room contrast is absorbed much by the first mesh patterns while the external light incident in the horizontal direction is relatively less absorbed by the second mesh patterns. Thus, a horizontal viewing angle may be sufficiently obtained while the bright room contrast is enhanced.

However, the height of the second mesh pattern does not necessarily have to be smaller than the height of the first mesh pattern. By reducing the size, including the width of the first mesh pattern and the interval between the first mesh patterns, at the same reduction rate, the height of the second mesh pattern may be maintained larger than or almost same as the height of the first mesh pattern while the performance of absorbing the external light incident in the vertical direction is maintained.

Each of the first and second mesh patterns may be formed of an external black conductive layer and an internal conductive layer. The external black conductive layer has a higher external light absorption rate than the inner conductive layer because the color of the external black conductive layer is darker than the inner conductive layer. Thus, the function incorporation layer may enhance the bright room contrast. In contrast, the inner conductive layer has a higher electrical conductivity than the external black conductive layer. Thus, the function incorporation layer may enhance an EMI shield function.

The mesh pattern may be formed by forming a black conductive layer on an inner wall of a groove of the base member forming the function incorporation layer, a conductive layer inside the groove to protrude from the upper surface of the function incorporation layer, and another black conductive layer on the conductive layer.

According to another aspect of the embodiment of the invention, there is provided a flat display panel including a display panel, a base film arranged on the front surface of the display panel, a function incorporation layer formed on a first surface of the base film, and a reflection prevention layer formed on the function incorporation layer, wherein the function incorporation layer shields electromagnetic interface and absorbs external light. Both of the function incorporation layer and the reflection prevention layer are provided on a single base film. Thus, manufacturing costs may be reduced, a manufacturing process may be simplified, and a flat display panel may be made thinner.

The base film may be attached to the flat display panel using a color correction adhesive. The color correction adhesive simultaneously performs a color correction function and an adhesive function. Since a color correction layer and an adhesive layer are incorporated, manufacturing costs may be reduced and a manufacturing process may be simplified.

Alternatively, the color correction layer may be arranged on a second surface of the base film and the color correction layer may be substantially attached to the first surface of the flat display panel using a transparent adhesive.

According to another aspect of an embodiment of the invention, there is provided a flat display panel including a display panel, a first base film arranged on the first surface of the display panel, a function incorporation layer formed on a first surface of the first base film, and a reflection prevention layer having a second base film formed on the function incorporation layer, wherein the function incorporation layer shields electromagnetic interface and absorbs external light. The reflection prevention layer is formed on a separate base film and the reflection prevention film is arranged on the function incorporation layer. The size of the reflection prevention film may be determined such that a mesh pattern at least one side edge portion of the function incorporation layer may be exposed. Thus, a separate separation process is not needed.

While the present invention has been described in connection with certain exemplary embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. An optical filter comprising:
   a base film; and
   a function incorporation layer on the base film and for shielding electromagnetic interference and absorbing external light, the function incorporation layer having a cross mesh pattern,
   wherein the cross mesh pattern comprises a plurality of pattern lines, each pattern line having a height, not all heights of the pattern lines being the same, and
   wherein at least a part of the cross mesh pattern protrudes from a surface of the function incorporation layer.

2. The optical filter of claim 1, wherein the function incorporation layer comprises a base member on the base film, and the cross mesh pattern having at least a part thereof embedded in the base member.

3. The optical filter of claim 2, wherein each of the pattern lines comprises:
   a first conductive layer; and
   a second conductive layer at least partially within the first conductive layer.

4. The optical filter of claim 2, wherein the base member has an inner wall defining a groove in the base member, and wherein each of the pattern lines comprises:
   a first conductive layer comprising an inner portion on the inner wall of the groove and an outer portion; and a second conductive layer being on the inner portion and having a first portion inside the groove and a second portion protruding from the surface of the function incorporation layer; and the outer portion of the first conductive layer being on the second conductive layer.

5. The optical filter of claim 4, wherein the first conductive layer has a higher external light absorption rate than that of the second conductive layer.

6. The optical filter of claim 4, wherein the second conductive layer has a higher electric conductivity than that of the first conductive layer.

7. The optical filter of claim 1, further comprising a reflection prevention layer, wherein the reflection prevention layer is coated on the function incorporation layer, exposed to light and developed to expose at least one edge portion.

8. The optical filter of claim 1, further comprising an other base film on the function incorporation layer and a reflection prevention layer on the other base film, wherein the reflection prevention layer is on the other base film, and the reflection prevention layer and the other base film have a smaller size than the function incorporation layer for exposing at least one edge portion of the cross mesh pattern to ground the cross mesh pattern.

9. The optical filter of claim 1, wherein the pattern lines comprise:
   a plurality of first pattern lines parallel to each other and extending in a substantially horizontal direction on a display panel; and
   a plurality of second pattern lines parallel to each other and extending in a substantially vertical direction on the display panel, the plurality of second pattern lines crossing the plurality of first pattern lines.

10. The optical filter of claim 1, wherein the pattern lines comprise:
    a plurality of first pattern lines parallel to each other and extending in a first direction on a display panel; and
    a plurality of second pattern lines parallel to each other and extending in a second direction on the display panel, and
    wherein at least one of the first direction or the second direction is inclined with respect to a vertical or horizontal imaginary line on the display panel, the plurality of second pattern lines crossing the plurality of first pattern lines.

11. The optical filter of claim 1, wherein the pattern lines comprise:
    a plurality of first pattern lines parallel to each other and separated by a first interval, each of the plurality of first pattern lines extending in a first direction and having a first width and a first height; and
    a plurality of second pattern lines parallel to each other and separated by a second interval, each of the plurality of second pattern lines extending in a second direction crossing the first direction and having a second width and a second height,
    wherein when the first width is substantially identical to the second width, the second height is smaller than the first height, and the second interval is larger than the first interval.

12. A display device comprising:
    a display panel;
    a base film on the display panel; and
    a function incorporation layer on the base film and for shielding electromagnetic interference and absorbing external light, the function incorporation layer having a cross mesh pattern,
    wherein the cross mesh pattern comprises a plurality of pattern lines, each pattern line having a height, not all heights of the pattern lines being the same, and
    wherein at least a part of the cross mesh pattern protrudes from a surface of the function incorporation layer.

13. The display device of claim 12, wherein the function incorporation layer comprises a base member on the base film, and the cross mesh pattern having at least a part thereof embedded in the base member.

14. The display device of claim 13, wherein each of the pattern lines comprises:
    a first conductive layer; and
    a second conductive layer at least partially within the first conductive layer.

15. The display device of claim 13, wherein the base member has an inner wall defining a groove in the base member, and wherein each of the pattern lines comprises:
    a first conductive layer comprising an inner portion on the inner wall of the groove and an outer portion; and
    a second conductive layer being on the inner portion and having a first portion inside the groove and a second portion protruding from the surface of the function incorporation layer facing toward a reflection prevention layer; and
    the outer portion of the first conductive layer being on the second conductive layer.

16. The display device of claim 15, wherein the first conductive layer has a higher external light absorption rate than that of the second conductive layer.

17. The display device of claim 15, wherein the second conductive layer has a higher electric conductivity than that of the first conductive layer.

18. The display device of claim 12, further comprising a reflection prevention layer, wherein the reflection prevention layer is coated on the function incorporation layer, exposed to light and developed to expose at least one edge portion.

19. The display device of claim 12, further comprising an other base film on the function incorporation layer and a reflection prevention layer on the other base film, wherein the reflection prevention layer is on the other base film, and the reflection prevention layer and the other base film have a smaller size than the function incorporation layer for exposing at least one edge portion of the cross mesh pattern to ground the cross mesh pattern.

20. The display device of claim 12, wherein the pattern lines comprise:
    a plurality of first pattern lines parallel to each other and extending in a substantially horizontal direction on a display panel; and
    a plurality of second pattern lines parallel to each other and extending in a substantially vertical direction on the display panel, the plurality of second pattern lines crossing the plurality of first pattern lines.

21. The display device of claim 12, wherein the pattern lines comprise:
    a plurality of first pattern lines parallel to each other and extending in a first direction on the display panel; and
    a plurality of second pattern lines parallel to each other and extending in a second direction on the display panel, and
    wherein at least one of the first direction or the second direction is inclined with respect to a vertical or horizontal imaginary line on the display panel, the plurality of second pattern lines crossing the plurality of first pattern lines.

22. The display device of claim 12, wherein the pattern lines comprise:

a plurality of first pattern lines parallel to each other and separated by a first interval, each of the plurality of first pattern lines extending in a first direction and having a first width and a first height; and a plurality of second pattern lines parallel to each other and separated by a second interval, each of the plurality of second pattern lines extending in a second direction crossing the first direction and having a second width and a second height, wherein when the first width is substantially identical to the second width, the second height is smaller than the first height, and the second interval is larger than the first interval.

23. The display device of claim 12, further comprising a color correction adhesive for attaching the base film to the display panel and for performing a color correction.

24. The display device of claim 12, further comprising:
a color correction layer on a surface of the base film facing the display panel; and
a transparent adhesive between the color correction layer and the display panel.

25. The display device of claim 12, further comprising a reflection prevention layer and another base film between the reflection prevention layer and the function incorporation layer, each of the reflection prevention layer and the another base film having a size for exposing the at least one edge portion of the cross mesh pattern to ground the mesh pattern.

26. A display device comprising:
a display panel;
a base film on the display panel;
a function incorporation layer on the base film and for shielding electromagnetic interference and absorbing external light, the function incorporation layer having a cross mesh pattern;
a reflection prevention layer on the function incorporation layer and having a size for exposing at least one edge portion of the cross mesh pattern to ground the cross mesh pattern,
wherein at least a part of the cross mesh pattern protrudes from a surface of the function incorporation layer facing toward the reflection prevention layer,
wherein the cross mesh pattern comprises:
a plurality of first pattern lines parallel to each other and separated by a first interval, each of the plurality of first pattern lines extending in a first direction and having a first width and a first height; and
a plurality of second pattern lines parallel to each other and separated by a second interval, each of the plurality of second pattern lines extending in a second direction crossing the first direction and having a second width and a second height,
wherein when the first width is set to be substantially identical to the second width, the second height is smaller than the first height, and the second interval is larger than the first interval, and
wherein each of the first and second pattern lines comprises:
a first conductive layer; and
a second conductive layer at least partially within the first conductive layer.

* * * * *